(12) United States Patent
Gmeinwieser et al.

(10) Patent No.: US 8,686,451 B2
(45) Date of Patent: Apr. 1, 2014

(54) OPTICAL-ELECTRONIC COMPONENT AND METHOD FOR PRODUCTION THEREOF

(75) Inventors: Nikolaus Gmeinwieser, Obertraubling (DE); Berthold Hahn, Hemau (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 408 days.

(21) Appl. No.: 12/865,836

(22) PCT Filed: Jan. 19, 2009

(86) PCT No.: PCT/DE2009/000056
§ 371 (c)(1),
(2), (4) Date: Dec. 6, 2010

(87) PCT Pub. No.: WO2009/094980
PCT Pub. Date: Aug. 6, 2009

(65) Prior Publication Data
US 2011/0175121 A1    Jul. 21, 2011

(30) Foreign Application Priority Data
Jan. 31, 2008 (DE) .......................... 10 2008 006 988

(51) Int. Cl.
*H01L 33/08* (2010.01)
*H01L 33/46* (2010.01)

(52) U.S. Cl.
USPC ........... 257/98; 257/79; 257/89; 257/E23.02; 257/E25.021; 257/E33.06; 438/29; 438/39; 438/46; 438/47; 438/93

(58) Field of Classification Search
USPC .................. 257/79, 89, 98, E25.02, E25.021, 257/E33.06, E33.068; 438/29, 39, 46, 47, 438/93, 94
See application file for complete search history.

(56) References Cited

U.S. PATENT DOCUMENTS

| | | | |
|---|---|---|---|
| 5,191,590 A | 3/1993 | Kuindersma et al. | |
| 5,805,630 A | 9/1998 | Valster et al. | |
| 6,066,861 A | 5/2000 | Hohn et al. | |
| 6,487,230 B1 | 11/2002 | Boucart et al. | |
| 7,459,727 B2 | 12/2008 | Stauss | |
| 7,521,856 B2 * | 4/2009 | Diekmann | 313/504 |

(Continued)

FOREIGN PATENT DOCUMENTS

| | | |
|---|---|---|
| CN | 1298553 A | 6/2001 |
| DE | 196 25 622 | 1/1998 |

(Continued)

OTHER PUBLICATIONS

English Translation of an Office Action dated Dec. 24, 2012 issued in the corresponding Taiwanese Patent Application No. 098102210.

*Primary Examiner* — Matthew W Such
*Assistant Examiner* — David Spalla
(74) *Attorney, Agent, or Firm* — Cozen O'Connor

(57) ABSTRACT

An optoelectronic component (100) comprises a first semiconductor layer stack (101), which has an active layer (110) designed for the emission of radiation and a main area (111). A separating layer (103) is arranged on said main area, said separating layer forming a semitransparent mirror. The optoelectronic component comprises a second semiconductor layer stack (102), which is arranged at the separating layer and which has a further active layer (120) designed for the emission of radiation.

14 Claims, 3 Drawing Sheets

(56) References Cited

U.S. PATENT DOCUMENTS

| | | |
|---|---|---|
| 7,692,202 B2 | 4/2010 | Bensch |
| 8,163,581 B1 * | 4/2012 | Or-Bach et al. ............ 438/39 |
| 2001/0028053 A1 | 10/2001 | Hohn et al. |
| 2004/0129944 A1 * | 7/2004 | Chen ............................ 257/89 |
| 2005/0230693 A1 | 10/2005 | Chen |
| 2007/0284565 A1 | 12/2007 | Leatherdale et al. |

FOREIGN PATENT DOCUMENTS

| | | |
|---|---|---|
| DE | 198 19 543 | 11/1999 |
| DE | 103 54 936 | 4/2005 |
| DE | 10 2004 004 765 | 9/2005 |
| DE | 10 2004 026 125 | 12/2005 |
| EP | 1 608 029 | 12/2005 |
| JP | 4-307783 | 10/1992 |
| JP | 7-058418 | 3/1995 |
| JP | 09-186365 | 7/1997 |
| JP | 2000-228563 | 8/2000 |
| JP | 2001-274462 | 10/2001 |
| JP | 2002-511661 | 4/2002 |
| JP | 2003-163373 | 6/2003 |
| JP | 2003-279955 | 10/2003 |
| JP | 2003-332619 | 11/2003 |
| JP | 2005-197650 | 7/2005 |
| JP | 2005-276899 | 10/2005 |
| JP | 2006-032315 | 2/2006 |
| JP | 2006-294697 | 10/2006 |
| JP | 2006-295132 | 10/2006 |
| JP | 2007-158133 | 6/2007 |
| JP | 2007-273975 | 10/2007 |
| JP | 2007-538408 | 12/2007 |
| JP | 2008-001540 | 1/2008 |
| JP | 2008-005140 | 1/2008 |
| JP | 2008-523615 | 7/2008 |
| TW | 516246 | 1/2003 |
| TW | 200411946 | 7/2004 |
| TW | 200539490 | 12/2005 |
| TW | 200729557 | 8/2007 |
| WO | WO 98/12757 | 3/1998 |
| WO | WO 99/57788 | 11/1999 |
| WO | WO 2005/055383 | 6/2005 |
| WO | WO 2006/062588 | 6/2006 |

* cited by examiner

OPTICAL-ELECTRONIC COMPONENT AND METHOD FOR PRODUCTION THEREOF

RELATED APPLICATIONS

This is a U.S. national stage of application No. PCT/DE2009/000056, filed on Jan. 19, 2009 and claims priority on German patent application No. 10 2008 006 988.4, filed on Jan. 31, 2008, the entire content of which is hereby incorporated by reference.

FIELD OF THE INVENTION

The invention relates to an optoelectronic component and a method for producing an electronic component.

BACKGROUND OF THE INVENTION

In order to generate white light with the aid of optoelectronic components, the optoelectronic semiconductor components are conventionally provided with an encapsulation containing a converter substance. Said converter substance converts the radiation of a first wavelength range (primary radiation) emitted by the optoelectronic component into radiation of a second wavelength range (secondary radiation), which differs from the first range. White light may be generated in this way either by the primary radiation being mixed with the secondary radiation or by the color components of the converted radiation mixed together producing white light.

A further conventional construction provides for jointly using a plurality of optoelectronic components which respectively emit radiations of different wavelength ranges. The overall radiation of the construction comprises the added wavelength ranges of the individual components.

SUMMARY OF THE INVENTION

It is an object of the invention to specify an optoelectronic component and a method for producing an optoelectronic component which can be produced more simply and in a more space-saving fashion and which is more effective.

This and other objects are attained in accordance with one aspect of the present invention directed to an optoelectronic component comprises a first semiconductor layer stack, which has a layer designed for the emission of radiation and a main area. A separating layer is arranged on said main area, said separating layer forming a semitransparent mirror. The optoelectronic component comprises a second semiconductor layer stack, which is arranged at the separating layer and which has a further active layer designed for the emission of radiation and a main area.

In one embodiment, the radiation which is emittable by the active layer of the first semiconductor layer stack is emittable from the main area of the first semiconductor layer stack. The emittable radiation of the active layer of the first semiconductor layer stack may couple into the second semiconductor layer stack. The emittable radiation of the active layer of the first semiconductor layer stack and the emittable radiation of the active layer of the second semiconductor layer stack may be emittable from the main area of the second semiconductor layer stack.

The active layers of the two semiconductor layer stacks may be designed to emit radiation of two different wavelength ranges. The separating layer may be transparent to radiation of a first wavelength range and be embodied for reflecting radiation of a second wavelength range.

The separating layer may furthermore be formed from at least two layers, wherein the layers have at least two different refractive indices. The separating layer may comprise an electrically conducting material; the separating layer may also comprise a dielectric. The separating layer may comprise a structuring. Moreover, the separating layer may comprise at least one cutout into which an electrically conductive material is introduced.

The optoelectronic component may furthermore comprise a first contact element of the first semiconductor layer stack, which is arranged on a further main area of the first semiconductor layer stack. The further main area lies opposite the first main area. The optoelectronic component may comprise a second contact element of the first semiconductor layer stack, which is arranged on an again further main area of the first semiconductor layer stack. The again further main area may be arranged between the main area and the further main area. The first contact element and the second contact element may provide an electrical contact to the active layer of the first semiconductor layer stack.

The first and the second semiconductor layer stacks of the optoelectronic component in each case comprise at least one n- and one p-doped layer. The first contact element makes contact with one of these layers of a first doping type and the second contact element makes contact with a further one of these layers of a second doping type.

A third contact element may be arranged at the second semiconductor layer stack, which contact element makes electrical contact with the active layer of the second semiconductor layer stack. Said third contact element may make contact with a layer of the first doping type.

In a further embodiment, the optoelectronic component may comprise a first contact element arranged at the second semiconductor layer stack, and a second contact element arranged at the second semiconductor layer stack, wherein the first contact element and the second contact element provide an electrical contact of the active layer of the second semiconductor layer stack. The component may have at least one further contact element which is arranged at the first semiconductor layer stack and makes electrical contact with the active layer of the first semiconductor layer stack.

The different semiconductor layer stacks of the optoelectronic component, in particular the respective layers designed for the emission of radiation, may in each case be individually drivable. In particular, the different semiconductor layer stacks of the optoelectronic component, in particular the respective layers designed for the emission of radiation, may in each case be individually electrically drivable. The optoelectronic component may emit light which is generated by combination of the radiation respectively emitted from the different semiconductor layer stacks.

The optoelectronic component may furthermore comprise a converter substance for the partial wavelength conversion of radiation. The converter substance may be arranged at the main area of the second semiconductor layer stack. The optoelectronic component may emit radiation which is generated by combination of the radiation emitted from the different semiconductor layer stacks and the radiation of the converter substance.

A method for producing an optoelectronic component comprises providing a first substrate, producing a first semiconductor layer stack having an active layer designed for the emission of radiation on the first substrate, and stripping away the substrate from the semiconductor layer stack.

A second substrate is provided, on which a second semiconductor layer stack having an active layer suitable for the emission of radiation is produced. The second substrate is stripped away from the second semiconductor layer stack.

The method furthermore comprises applying a separating layer, which forms a semitransparent mirror, on at least one of the semiconductor layer stacks, and applying the second semiconductor layer stack to the first semiconductor layer stack, such that the separating layer is arranged between the first and the second semiconductor layer stacks.

A first auxiliary carrier may be applied on a further main area of the second semiconductor layer stack, said further main area lying opposite a main area of the second semiconductor layer stack. A second auxiliary carrier may be applied on the main area of the second semiconductor layer stack. The first auxiliary carrier and the second auxiliary carrier may be stripped away again. A further auxiliary carrier may be applied on a main area of the first semiconductor layer stack and be stripped away again.

The method may furthermore comprise forming at least two contact elements to the active layer of the first semiconductor layer stack. At least one further contact element to the active layer of the second semiconductor layer stack may be formed.

In a further embodiment, the method may comprise forming at least two contact elements to the active layer of the second semiconductor layer stack. At least one further contact element to the active layer of the first semiconductor layer stack may be formed.

Producing the semiconductor layer stacks may comprise in each case epitaxially depositing at least two differently doped semiconductor layers and in each case structuring the doped semiconductor layers to form their electrical contact-connections.

In the first semiconductor layer stack, at least one cutout may be formed which extends through a layer of a first doping type and through the active layer at least as far as to a layer of a second doping type.

In the second semiconductor layer stack, at least one cutout may be formed which extends through a layer of a first doping type and through the active layer at least as far as to a layer of a second doping type.

The separating layer may be formed from at least two layers, wherein the at least two layers have at least two different refractive indices. The separating layer may have a structuring. The separating layer may be embodied with at least one cutout, and said cutout may be filled with an electrically conducting material.

A converter substance for partial wavelength conversion of the emittable radiation may be applied to the main area of the second semiconductor layer stack.

DETAILED DESCRIPTION OF THE DRAWINGS

Figure 1:
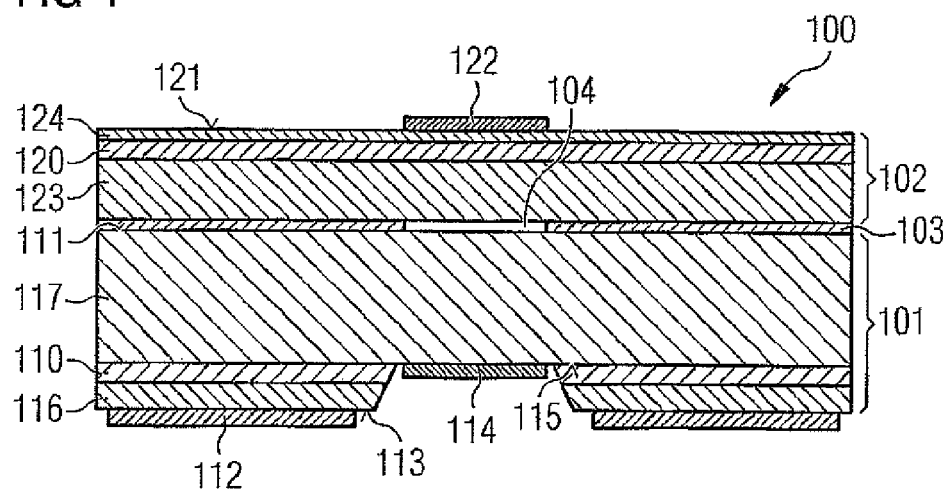
FIG. 1 shows a schematic illustration of an optoelectronic component in accordance with one embodiment.

FIG. 1 shows an optoelectronic component 100, which has a first semiconductor layer stack 101 and a second semiconductor layer stack 102. FIG. 1 furthermore shows a separating layer 103, having a cutout 104, an active layer 110, a first main area 111, a first contact element 112, a further main area 113, a further contact element 114, a further main area 115, a second active layer 120, a main area 121 of the second semiconductor layer stack, and a further contact element 122.

The semiconductor layer stack 101 comprises three layers in the figure shown. A first layer (116) has a first doping type, for example p-doped, and a main area 113. Opposite the area 113, the first layer is adjoined by the active layer 110. The active layer is adjoined by a further semiconductor layer (117), which is n-doped, for example. The active layer has a radiation-generating pn-junction formed by means of the p-doped and the n-doped layers adjoining the active layer.

The separating layer 103 can be arranged on the main area 111. The separating layer can surround the cutout 104 as in the exemplary embodiment shown. The second semiconductor layer stack, which can likewise comprise three layers, for example, can be arranged on the separating layer. The layer (123) adjoining the separating layer is an n-doped layer, for example. This can be followed by an active layer and a p-doped layer (124). The active layer again has a radiation-generating pn junction. Both the first and the second semiconductor layer stacks can also have more than three layers, for example an additional buffer layer. The layers which respectively adjoin the separating layer from the first and the second semiconductor layer stacks can have the same doping type.

The separating layer can be formed from a plurality of layers. The separating layer has at least two layers, which can differ from one another in terms of material or layer thickness. The layers of the separating layer can each have different refractive indices. The refractive indices of the layers repeat at regular intervals, for example. The separating layer is a dielectric, for example. It can be formed from silicon oxide, from zinc oxide or indium zinc oxide, but it can also comprise a different material. The separating layer can comprise a structuring, for example a microstructuring, in particular a nanostructuring, in particular at least one photonic crystal, which is formed at the first, at the second, or at both semiconductor layer stacks.

The contact element 112 can be arranged at the main area 113 of the, for example, p-doped layer of the first semiconductor layer stack. The contact element can be formed from one contact area, but it can also be formed from a plurality of contact areas.

In the embodiment shown, the main area 121 is at the furthest distance from the main area 113. The main area 111 is at a lesser distance than the main area 121 from the main area 113. The main area 115 is at a lesser distance than the main area 111 from the main area 113.

The semiconductor layer stack 101 can have, for making contact with the, for example, n-doped layer, a cutout extending through the p-doped region and the active layer. In this embodiment, the n-doped layer has a main area 115, for example, to which a second contact element 114 can be applied. The semiconductor stack can have one cutout of this type, but it can also have a plurality of such cutouts.

The contact elements are formed from an electrically conducting material, for example. Via the contact elements, the semiconductor layer stack 101 can be supplied with a voltage if the optoelectronic component is mounted on a corresponding carrier element. The radiation emitted by the semiconductor layer stack, in particular the active layer 110, when voltage is applied emerges principally from the area 111.

In order to apply a voltage to the second semiconductor layer stack 102, the contact element 122 can be fitted on the area 121. The contact element can be formed from one contact area, but it can also be formed from a plurality of contact areas. The contact element 122 makes contact with the, for example, p-doped layer. The, for example, n-doped layer of the layer stack 102 is contact-connected via the contact element 114, or via the separating layer or by a conducting material in the cutout 104 of the separating layer. The semiconductor layer stack 102 is therefore supplied with voltage by the contact elements 114 and 122, for example. The contact elements can have light-transmissive conductors comprising indium zinc oxide, for example.

In one embodiment, the contact elements can make contact with the active layers from the direction of the area 121. At least one cutout through the layer 124 and the layer 120 can be formed. At least one cutout through the layer 124, the layer 120, the layer 123, and the separating layer can be formed. At least one cutout through the layer 124, the layer 120, the layer 123, the separating layer, the layer 117 and the active layer 110 can be formed. At least one further cutout through other layers can be formed. At least one contact element in each case can be arranged in the cutout.

The semiconductor layer stacks respectively emit radiation of different wavelength ranges. The semiconductor layer stack 101 emits, for example, radiation having longer wavelengths than the semiconductor layer stack 102. By way of example, the first semiconductor layer stack 101 emits radiation in the red color range (625 to 740 nm); the semiconductor layer stack 102 emits radiation in the blue color range (400 to 500 nm).

The separating layer can be as transparent as possible to the wavelength range of the emitted radiation of the semiconductor layer stack 101. The separating layer is as opaque as possible to the emitted radiation of the semiconductor layer stack 102 and reflects a greatest possible proportion of this radiation. A reabsorption of the radiation of the semiconductor layer stack 102 in the semiconductor layer stack 101 can thus be prevented to the greatest possible extent. Both the emitted radiation of the semiconductor layer stack 101 and the emitted radiation of the semiconductor layer stack 102 substantially emerge from the area 121. The spectral ranges of the respective emitted radiation add up to form an overall spectrum.

As a result of different voltages being applied to the respective semiconductor layer stacks, it is possible for the different wavelength ranges to participate in the overall spectrum to different extents. Thus, setting of a desired color locus is possible during the operation of the optoelectronic component.

Figure 2:
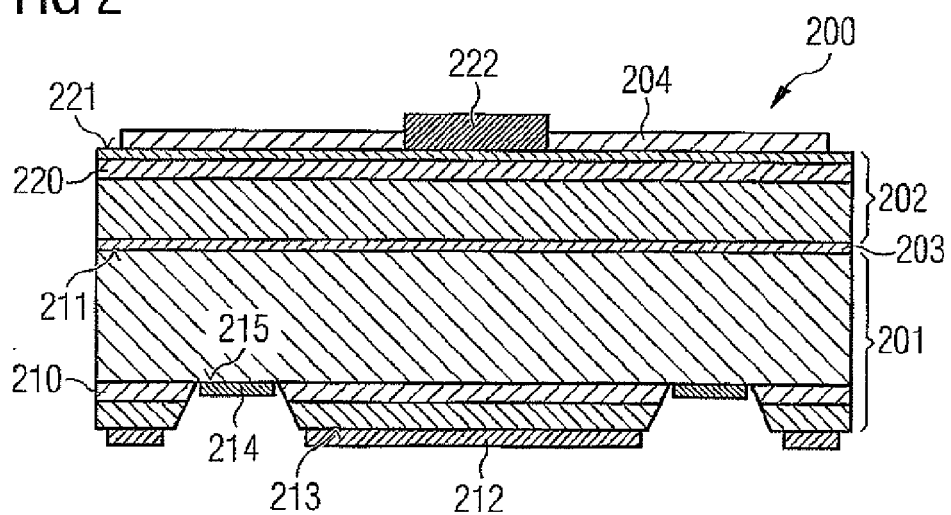
FIG. 2 shows a further schematic illustration of an optoelectronic component.

FIG. 2 shows an optoelectronic component 200 comprising a semiconductor layer stack 201 and a further semiconductor layer stack 202. FIG. 2 furthermore shows a separating layer 203, a converter substance 204, a first active layer 210, a main area 211, a first contact element 212, a second main area 213, a second contact element 214, a further main area 215, an active layer 220, a further main area 221, and a contact element 222.

The semiconductor layer stack 201 has at least three layers, for example a p-doped layer, an active layer and an n-doped layer. It furthermore has cutouts extending as far as the, for example, n-doped layer. The separating layer is arranged on the n-doped layer opposite a main area 213 arranged at the, for example, p-doped layer. In the exemplary embodiment shown, the separating layer is electrically conductive.

By way of example, the second semiconductor layer stack 202, which likewise comprises three layers, for example, is arranged on the separating layer. An n-doped layer is arranged adjacent to the separating layer. The active layer is arranged adjacent to the n-doped layer and a p-doped layer is arranged adjacent to the active layer. The p-doped layer has the main area 221. The converter substance can be arranged on said main area 221.

The converter substance, if it is excited by electromagnetic radiation of a specific wavelength range, can emit radiation of a different wavelength range. For this purpose, it can contain at least one phosphor. The phosphor can contain inorganic or organic phosphors.

The wavelength ranges of the exciting radiation and of the emitted radiation of the converter substance can differ. The converter substance can either convert the entire radiation impinging on it; it can also convert only part of the impinging radiation and transmit the remaining part without significantly influencing the wavelength range of the transmitted radiation.

In the cutouts of the semiconductor layer stack 201, the contact element 214 can be arranged on a main area 215. The further contact element 212 can be arranged on the main area 213. Via the contact elements, the semiconductor layer stack can be supplied with a voltage and thus emit radiation. The radiation is transmitted by the separating layer 203. The radiation couples into the second semiconductor layer stack 202.

The arrangement of the contact elements can be chosen freely. The semiconductor layer stack can be embodied for p-side contact-connection and for n-side contact-connection from its front side, for p-side and n-side contact-connection from its rear side, for p-side contact-connection from its front side and for n-side contact-connection from its rear side, for n-side contact-connection from its front side and for p-side contact-connection from its rear side, and for n- and/or p-side contact-connection both from the front and from the rear side.

The semiconductor layer stack 202 can be supplied with voltage via the contact element 222 arranged on the main area 221, for example, and via the contact element 214 and hence also via the separating layer 203. In this embodiment, the separating layer comprises electrically conductive material. If the separating layer has an electrically insulating effect, it comprises at least one cutout filled with an electrically conductivng material, as shown in FIG. 1. The semiconductor layer stack 202 can thus emit radiation if a voltage is applied. The radiation in a wavelength range emitted by the active layer of the semiconductor layer stack 202 is reflected as well as possible by the separating layer 203.

The emitted radiation of the first semiconductor layer stack lies in a different wavelength range than the emitted radiation of the second semiconductor layer stack. The converter substance converts part of the radiation which lies in the wavelength range of the second semiconductor layer stack. The converter substance can transmit radiation lying in the wavelength range of the first semiconductor layer stack. The overall spectrum of the emitted radiation of the semiconductor component can thus be composed of at least three different wavelength ranges, for example.

Figure 3A:
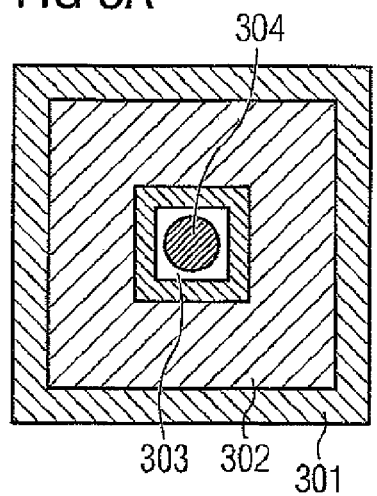
FIGS. 3A and 3B show a schematic plan view of an exemplary embodiment of an optoelectronic component and, respectively, a schematic view of the underside of an optoelectronic component.
Figure 3B:
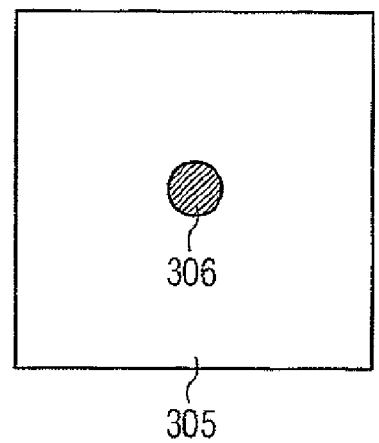

FIGS. 3A and 3B show a main area 301, a contact element 302, a further main area 303, a further contact element 304, a further main area 305 and a further contact element 306.

FIG. 3A shows a view of the underside of an optoelectronic component shown in FIG. 1, for example. The area 301 is the area of a, for example, p-doped semiconductor layer. The contact element 302 is applied on this area. The contact element can be a continuous element, as in the embodiment shown. However, it can also be formed from a plurality of individual regions. The component can have, for example centrally, a cutout extending through the, for example, p-doped layer and an active layer as far as to a, for example, n-doped layer. This, for example, n-doped layer has the main area 303. A further contact element 304 can be applied on this main area. The contact elements 302 and 304 serve to enable the semiconductor component to be supplied with voltage. The doping types of the layers can also be different than in this embodiment; by way of example, the p-doped layer can be an n-doped layer, and vice versa. The underside of the optoelectronic component can have further elements, for example metallizations or carrier substrate.

FIG. 3B shows a surface of an optoelectronic component corresponding to FIG. 3A. This component has the main area 305, to which the contact element 306 is applied. The contact element 306 is applied directly above the contact element 305, for example.

By virtue of the arrangement of the contact element 306 directly above the contact element 305, the component has overall to the smallest possible extent regions from which no radiation is emitted. However, the contact element 306 can also be arranged at a different location of the main area 305, for example in an edge region. A plurality of contact elements can also be arranged. In particular, the numbers of the contact elements 305 and 306 can differ. A transparent, conductive material can be applied between the contact element and the main area in order to improve the contact-connection.

Figure 4A:
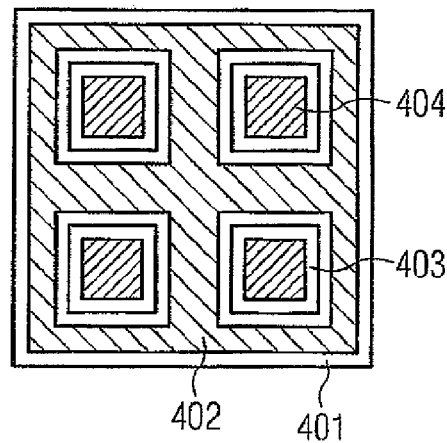
FIGS. 4A and 4B show a schematic plan view of a further exemplary embodiment of an optoelectronic component and, respectively, a plan view of an underside of an optoelectronic component.
Figure 4B:
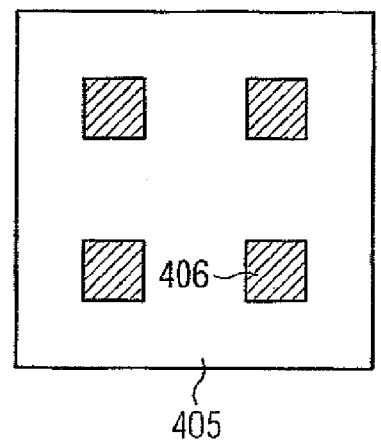

FIGS. 4A and 4B show a main area 401, a first contact element 402, a main area 403, a second contact element 404, a further main area 405, a further contact element 406.

FIG. 4A shows the structure shown in FIG. 3A embodied four times at a component. The contact element 402 can be applied to the main area 401. The contact element can be formed from a plurality of individual parts. The cutouts which enable contact to be made with the area 403 can be repeated as often as desired. In the exemplary embodiment shown, four cutouts with contact elements 404 are arranged symmetrically, but the cutouts can also be arranged differently.

FIG. 4B shows a corresponding plan view of a component. The contact elements 406 can be arranged on the main area 405 above the contact elements 404. In this case, they can comprise exactly the same number of individual parts as the contact element 404, but fewer or more individual parts can also be present. The individual parts of the contact element 406 can be arranged directly above the elements 404, as shown, but they can also be arranged in any different manner desired on the contact area 405.

Figure 5A:
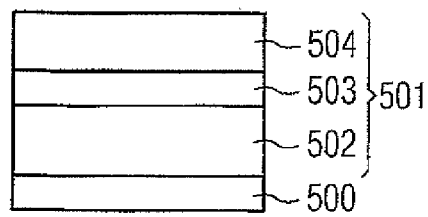
FIGS. 5A to 5H show schematic sectional views of a semiconductor layer stack during different method stages.

FIG. 5A shows a detail from a substrate wafer 500, and a semiconductor layer stack 501 comprising a doped layer 502, an active layer 503 and a further doped layer 504.

The substrate wafer is formed from gallium arsenide, for example. The semiconductor layer stack can contain further layers. The substrate wafer can also be formed from some other suitable material. In a method, a plurality of semiconductor layer stacks can be formed on a substrate wafer, which are singulated in a later method step.

In one method step, the layers of the semiconductor layer stack 501 are grown on the substrate. In this case, the semiconductor layer is grown on the substrate beginning with an n-doped layer, for example. Afterwards, by way of example, the active layer and a p-doped layer are grown. The substrate can subsequently be removed from the semiconductor layer stack. Before the substrate is removed, an auxiliary carrier can be applied to the semiconductor layer stack.

Figure 5B:
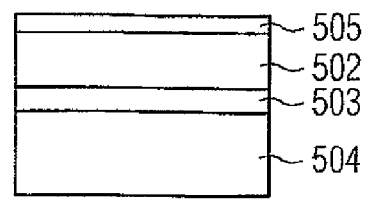

FIG. 5B shows the semiconductor layer stack from FIG. 5A without the substrate wafer. A separating layer 505 has been applied to the layer 502. Said separating layer has been formed from a plurality of layers, for example. The separating layer forms a mirror, which is semitransparent. The separating layer is, by way of example, as transparent as possible to specific wavelength ranges and reflects other wavelength ranges.

Figure 5C:
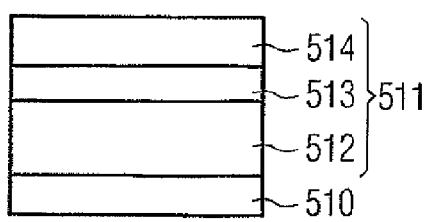

FIG. 5C shows a further substrate wafer 510, and a further semiconductor layer stack 511 comprising a first doped layer 512, an active layer 513 and a further doped layer 514. The layer stack is grown on the substrate wafer, which comprises sapphire, for example. It can also comprise more than 3 layers. By way of example, the semiconductor layer stack is grown beginning with an n-doped layer. A plurality of semiconductor layer stacks can be formed on the substrate wafer 510, which are singulated in a later method step.

The separating layer 505 can also be applied on the layer stack 511. It can also be applied on one of the layer stacks, but it can also be applied to both layer stacks.

Figure 5D:
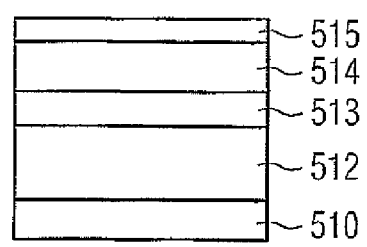

FIG. 5D shows a method step of an exemplary embodiment in which an auxiliary carrier 515 is applied on the second semiconductor layer stack, in particular on the layer 514.

Figure 5E:
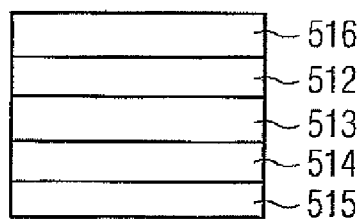

As shown in FIG. 5E, a second auxiliary carrier 516 can be applied to the semiconductor layer stack 511, in particular to the layer 512, and the substrate 510 can be stripped away from the semiconductor layer stack.

Figure 5F:
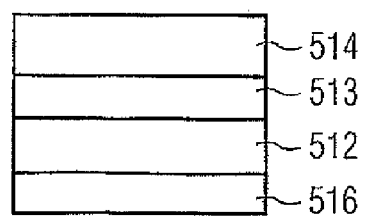

In FIG. 5F the method step of stripping away the first auxiliary carrier 515 has already been performed. The elements shown in FIG. 5B and in FIG. 5F can be combined.

Figure 5G:
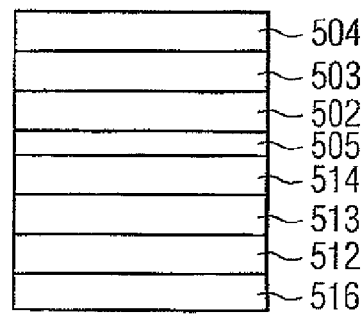

FIG. 5G shows the element from FIG. 5B, which element was applied to the layer 514, such that the separating layer 505 is arranged between the two layer stacks.

Figure 5H:
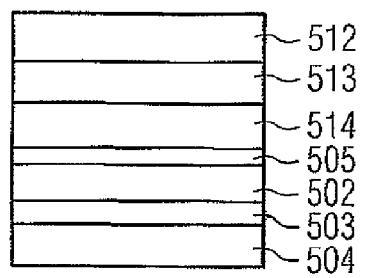

FIG. 5H shows the layer stacks after the second auxiliary carrier 516 was stripped away from the layer 512. The layer stack shown now substantially corresponds to that of a component as shown in FIG. 1.

The method can comprise further method steps, for example applying a converter substance to the layer 512, or forming contact elements on the semiconductor layers. The method can furthermore comprise forming a cutout of the separating layer and filling the separating layer with a conducting material. In particular, the method need not comprise all the method steps mentioned above. By way of example, the first semiconductor layer stack can be applied to the second semiconductor layer stack before the substrate is removed. The production of the semiconductor layer stacks can in each case have no, one or two auxiliary carriers.

The invention claimed is:

1. An optoelectronic component comprising:
   a first semiconductor layer stack, which has an active layer designed for the emission of radiation and a main area;
   a separating layer, which is arranged on the main area of the first semiconductor layer stack, wherein the separating layer forms a semitransparent mirror;
   a second semiconductor layer stack, which is arranged at the separating layer and which has a further active layer designed for the emission of radiation and a main area;
   a first contact element of the first semiconductor layer stack arranged on a further main area of the first semiconductor layer stack, wherein the further main area lies opposite the main area; and
   a second contact element of the first semiconductor layer stack on an again further main area of the first semiconductor layer stack, wherein the again further main area is arranged between the main area and the further main area, wherein the first contact element and the second contact element provide an electrical contact of the active layer of the first semiconductor layer stack.

2. The optoelectronic component as claimed in claim 1, wherein the emittable radiation of the active layer of the first semiconductor layer stack couples into the second semiconductor layer stack and the emittable radiation of the active layer of the first semiconductor layer stack and the emittable radiation of the active layer of the second semiconductor layer stack are emittable from the main area of the second semiconductor layer stack.

3. The optoelectronic component as claimed in claim 1, wherein the active layer of the first semiconductor layer stack is designed to emit radiation of a first wavelength range, and the active layer of the second semiconductor layer stack is designed to emit radiation of a second wavelength range.

4. The optoelectronic component as claimed in claim 3, wherein the separating layer is transparent to radiation of the first wavelength range and is embodied for reflecting radiation of the second wavelength range.

5. The optoelectronic component as claimed in claim 1, wherein the separating layer comprises at least two layers, wherein the layers have at least two different refractive indices.

6. The optoelectronic component as claimed in claim 1, wherein the separating layer comprises an electrically conducting material.

7. The optoelectronic component as claimed in claim 1, wherein the separating layer comprises a dielectric.

8. The optoelectronic component as claimed in claim 1, wherein the separating layer has a structuring.

9. The optoelectronic component as claimed in claim 7, wherein the separating layer comprises at least one cutout into which an electrically conducting material is introduced.

10. The optoelectronic component as claimed in claim 1, further comprising:
   a first contact element arranged at the second semiconductor layer stack, and
   a second contact element arranged at the second semiconductor layer stack, wherein the first contact element and the second contact element provide an electrical contact of the active layer of the second semiconductor layer stack.

11. The optoelectronic component as claimed in claim 1, wherein the different semiconductor layer stacks are in each case individually drivable.

12. The optoelectronic component as claimed in claim 1, further comprising: a converter substance for the partial wavelength conversion of radiation, wherein the converter substance is arranged at the main area of the second semiconductor layer stack.

13. A method for producing an optoelectronic component, comprising:
   providing a first substrate;
   producing a first semiconductor layer stack having an active layer designed for the emission of radiation on the first substrate;
   stripping away the substrate from the first semiconductor layer stack;
   providing a second substrate;
   producing a second semiconductor layer stack having an active layer suitable for the emission of radiation on the second substrate;
   stripping away the second substrate from the second semiconductor layer stack;
   applying a separating layer, which forms a semitransparent mirror, on at least one of the semiconductor layer stacks;
   applying the second semiconductor layer stack to the first semiconductor layer stack, such that the separating layer is arranged between the first and the second semiconductor layer stacks;
   forming a first contact element of the first semiconductor layer stack arranged on a further main area of the first semiconductor layer stack, wherein the further main area lies opposite the main area; and
   forming a second contact element of the first semiconductor layer stack on an again further main area of the first semiconductor layer stack, wherein the again further main area is arranged between the main area and the further main area, wherein the first contact element and the second contact element provide an electrical contact of the active layer of the first semiconductor layer stack.

14. The method as claimed in claim 13, comprising:
   forming at least one cutout of the separating layer; and
   filling the cutout of the separating layer with an electrically conducting material.

* * * * *